(12) United States Patent
Wasson

(10) Patent No.: US 6,181,151 B1
(45) Date of Patent: Jan. 30, 2001

(54) INTEGRATED CIRCUIT TESTER WITH DISK-BASED DATA STREAMING

(75) Inventor: Will Wasson, Livermore, CA (US)

(73) Assignee: Credence Systems Corporation, Fremont, CA (US)

(*) Notice: Under 35 U.S.C. 154(b), the term of this patent shall be extended for 0 days.

(21) Appl. No.: 09/181,939

(22) Filed: Oct. 28, 1998

(51) Int. Cl.[7] .................................................. G01R 31/00
(52) U.S. Cl. ............................................................ 324/765
(58) Field of Search .............................. 324/73.1, 158.1, 324/765, 763; 714/700, 730, 736; 395/183.08

(56) References Cited

U.S. PATENT DOCUMENTS

| | | | |
|---|---|---|---|
| 4,497,056 | * | 1/1985 | Sugamori .............................. 714/736 |
| 4,931,723 | * | 6/1990 | Jeffrey et al. ........................ 324/73.1 |
| 5,225,772 | * | 7/1993 | Cheung et al. ...................... 324/73.1 |
| 5,737,512 | * | 4/1998 | Proudfoot et al. .............. 395/183.08 |

* cited by examiner

*Primary Examiner*—Vinh P. Nguyen
(74) *Attorney, Agent, or Firm*—Daniel J. Bedell; Smith-Hill and Bedell

(57) ABSTRACT

An integrated circuit (IC) tester includes set of tester channels, each for carrying out a test activity at a separate terminal of an IC device under test (DUT) during each cycle of a test. The tester also includes a disk drive having a removable disk for reading out scan or programming data to the tester channels during a test. Each tester channel includes an instruction memory for storing a set of instructions, and each tester channel executes its stored instructions during the test. Some of the instructions include VECTOR data directly indicating a particular test activity the tester channel is to carry out at a DUT terminal during a next test cycle. Others of the instructions tell the tester channel to acquire a particular number (N) of serial data bits as they are read out of the disk drive and to carry out an activity during each of the next N test cycles indicated by a state of a corresponding one of the N serial data bits.

12 Claims, 2 Drawing Sheets

INTEGRATED CIRCUIT TESTER WITH DISK-BASED DATA STREAMING

BACKGROUND OF THE INVENTION

1. Field of the Invention

Figure 1:
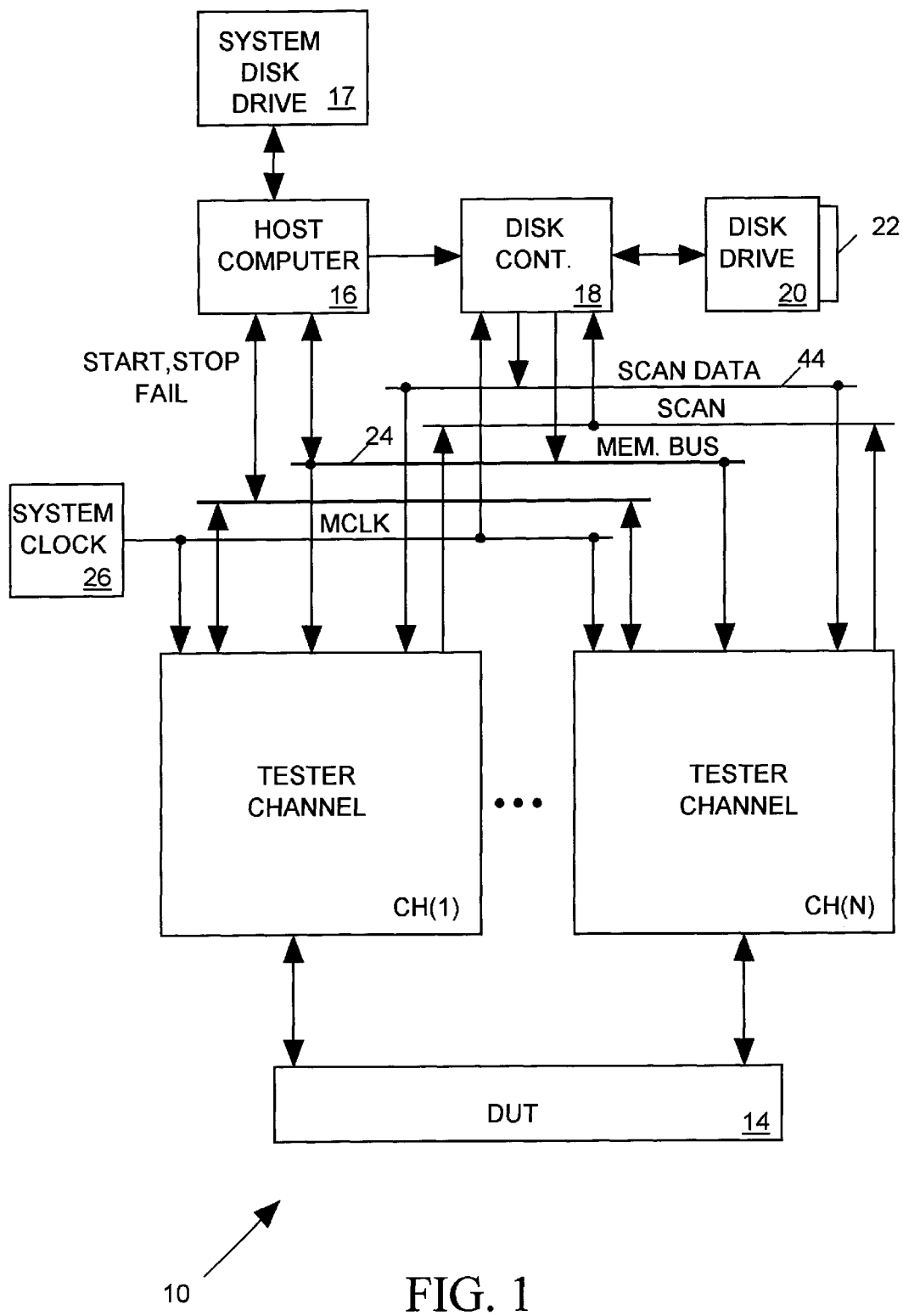

The present invention relates in general to integrated circuit testers and in particular to a tester that uses a disk drive as a source of data during a test.

2. Description of Related Art

A typical integrated circuit (IC) tester includes a separate channel for each terminal of an IC to be tested. Each channel includes a pin electronics circuit capable of either supplying a test signal to the IC terminal or sampling the state of an IC output appearing at the terminal to determine its state. A typical IC tester organizes a test into a succession of test cycles, and prior to each test cycle the pin electronics circuit of each channel receives an input "vector" (instruction) referencing the test activity that the pin electronics circuit is to carry out during the test cycle. Each tester channel also includes a vector memory for storing the sequence of vectors to be supplied to the local pin electronics circuit during the test. The tester is programmed by loading an appropriate vector sequence into the vector memory of each channel. During the test, a sequencer sequentially addresses the vector memory in each channel so that it reads out a vector for each test cycle and delivers it to the pin electronics circuit.

In addition to normal input and output terminals, some ICs also include "scan" terminals which enable a tester to ascertained states of internal IC nodes at some point during a test. When the tester supplies an appropriate serial data sequence to one of the ICs scan terminals, the IC produces an output data sequence at another of the IC's scan terminals indicating the states of various internal IC nodes. When an IC test reaches the point at which the states of various internal nodes are to be ascertain, the tester channels that drive normal IC input terminals hold their output test signals to particular states while the channels accessing the scan terminals supply input scan data to the IC and acquire the resulting IC output scan data.

During normal test cycles, the tester channels that access scan terminals are "idle" because they don't send input scan data to or acquire output scan data from the IC. But each channel accessing a scan terminal still requires an input vector during each normal test cycle to hold it to a proper state during the test cycle. Thus the vector memory for a channel accessing a scan terminal must not only provide a vector to tell the channel what to do during each scan test cycle, it must also provide a vector for every normal test cycle as well. During scan test cycles the tester channels accessing normal IC input and output are "idle" in that they simply hold IC input signal to fixed states and cease sampling IC output signals. Nonetheless each such tester channel accessing an IC input or output terminal still requires an input vector to tell it what to do during each scan test cycle. Thus regardless of whether a tester channel accesses a normal IC input/output terminal or a scan terminal, its vector memory must store and provide a vector for every normal test cycle and for every scan test cycle. When a test involves large numbers of both normal and scan test cycles, vector memories have to be big.

Programmable logic devices (PLD's) such as field programmable gate arrays are programmed to carry out various logic operations by programming data sequences applied to special programming input terminals. When an IC tester tests a PLD it uses one tester channel to supply a sequence of programming data to the programming input terminal to program the PLD in some desired way and then uses tester channels accessing the normal input and output terminals of the PLD to test its logic. To fully test a PLD, the tester programs the PLD for several different logic operations and tests the PLD's logic operation each time it is programmed.

The process of supplying programming data to a PLD programming input is similar to providing scan data to an IC scan terminal. Regardless of whether a tester supplies a serial data stream to a PLD programming terminal or to an IC scan input terminal, every channels vector memory must provide a vector for every programming or scan cycle and for every normal test cycle.

One method for reducing the need for large vector memories has been to provide a separate sequencer in each channel which can stop the flow of vectors at various times during a test. Assume for example that the first N cycles of a test are normal test cycles and the next M cycles of a test are scan test cycles. During the first test cycle, the sequencer in each channel read addresses the first address of the channel's vector memory so that it reads out a vector to the local pin electronics circuit. In the channels accessing scan terminals, that vector tells the pin electronics circuit to put the scan terminal in the state that is appropriate for normal test operations. During the next N-1 test cycles, the sequencer in each channel accessing a scan terminal simply holds its vector memory at the same address so that the vector at the first vector memory address is repeatedly sent to the pin electronics circuit. In the meantime during the first N test cycles the sequencer in each channel accessing a normal IC input or output terminal continues to increment the address of its local vector memory in the normal fashion so that it provides a sequence of vectors to the pin electronics circuit. On test cycle N+1, the sequencers in the channels accessing scan terminals begin incrementing their vector memory addresses so that the pin electronics circuit begins carrying out the scan test. The sequencers in the channels accessing normal IC input/output terminals stop incrementing their vector memories so that their pin electronics circuits continue to receive the vector at memory address N+1 during the M cycles of the scan test. Such a tester architecture is also useful in the context of testing PLDs since sequencers can halt the flow of vectors in channels accessing normal IC input/output terminals during programming cycles and can halt the flow of vectors in channels accessing PLD programming terminals during logic test cycles.

As PLDs increase in size the amount of programming data that must be supplied to a PLD can be very large, requiring more storage capacity than the vectors needed to test the PLD once it has been programmed. Some integrated circuit testers provide vector memories in the channels that are only large enough to hold the vectors needed for normal test cycles and provide a large central memory for storing scan or programming data. During the scan or programming phases of a test, a bus delivers the scan or programming data read out of the large central memory to the tester channel(s) accessing the scan or programming terminals of the device under test. During normal test cycles all channels obtain vectors from their local vector memories in the normal fashion.

Rather than directly storing the vector sequences needed to tell the channels to produce scan or programming data, the central memory directly stores the sequence of scan or programming data bits that the channels are to provide to the scan or programming terminals of the IC under test. As the scan or programming data arrives at a tester channel, a decoder converts each bit of the data to a vector appropriate to cause the local pin electronics circuit to send the scan or programming data bit to the IC. Since a multiple bit vector may be needed to tell a pin electronics circuit to generate single scan or programming data bit, it is more efficient to store scan or programming data than vectors in the central memory.

As IC and PLD's and the manner in which they are tested have become more complex, impractically large central memories are needed supply the channels with scan and programming data. What is needed is a system for economically storing and supplying very large amounts of scan or programming data to integrated circuit tester channels.

SUMMARY OF THE INVENTION

The present invention relates to an integrated circuit (IC) tester for testing an IC of the type having scan or programming terminals as well as normal signal input and output terminals.

An integrated circuit (IC) tester in accordance with the invention includes set of tester channels, each for carrying out a test activity at a separate terminal of an IC device under test (DUT) during each cycle of a test. The tester also includes a disk drive having a removable disk for reading out scan or programming data to the tester channels during a test. Each tester channel includes an instruction memory for storing a set of instructions, and each channel executes its stored instructions during the test. Some of the instructions include VECTOR data directly indicating a particular test activity the channel is to carry out at a DUT terminal during a next test cycle. Others of the instructions tell the channel to acquire a particular number (N) of serial data bits as they are read out of the disk drive and to carry out an activity during each of the next N test cycles indicated by a state of a corresponding one of the N serial data bits.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 2:
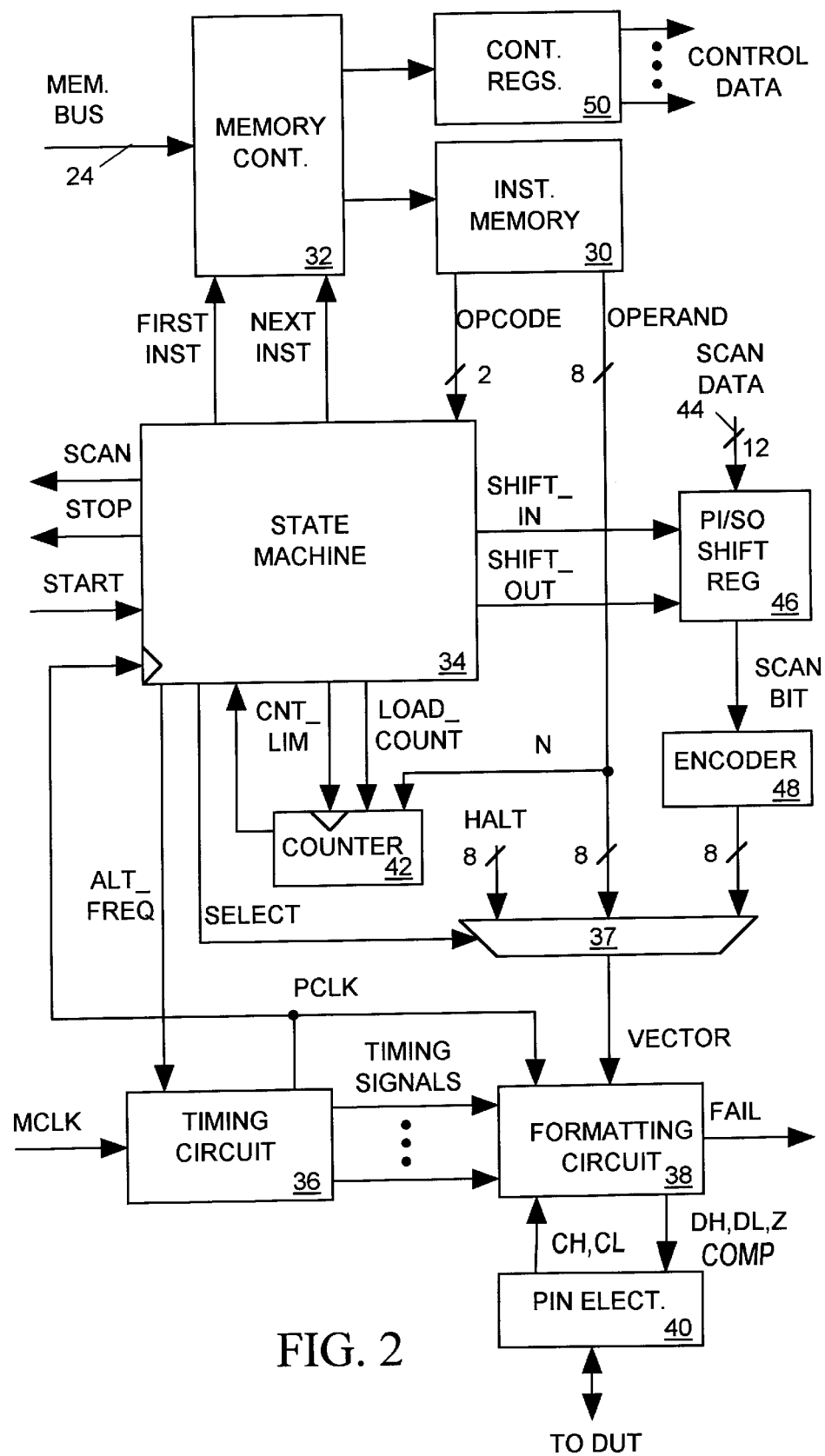

FIG. 1 depicts in block diagram form an integrated circuit (IC) tester in accordance with the present invention, and FIG. 2 depicts in block diagram form a typical channel of the tester of FIG. 1.

DESCRIPTION OF THE PREFERRED EMBODIMENT(S)

Tester Architecture

FIG. 1 depicts in block diagram form an integrated circuit (IC) tester 10 in accordance with the present invention. Tester 10 includes a set of N tester channels CH(1)–CH(N) each carrying out test activities at a separate terminal of an IC device under test (DUT) 14 during a test. The test is organized into a succession of test cycles, and during each test cycle each channel CH(1)–CH(N) may either drive a DUT input signal to a particular state or sample a DUT output signal to determine its state.

Tester 10 is adapted for testing DUTs of the type having in addition to a set of logic signal input and output terminals, a set of "scan" terminals enabling the tester to ascertain states of internal DUT nodes not otherwise accessible via normal DUT output terminals. When tester 10 supplies an appropriate serial data sequence to one of the DUT's scan terminals, while holding normal DUT logic signal input and output terminals at fixed states, DUT 14 produces an output data sequence at another of its scan terminals indicating the current states of various internal DUT nodes.

When tester 10 tests a DUT having scan terminals, there are two types of test cycles. During "logic test" cycles, the tester channels that access normal DUT input/output terminals stimulate the DUT with test signals and monitor its output signal to determine its response. Tester channels that access scan terminals are idle in that they do not actively supply input scan data to the DUT or monitor output scan data produced by the DUT. During "scan" cycles, the tester channels that access normal terminals are idle while the tester channels accessing the scan terminals supply input scan data to DUT 14 or acquire output scan data from DUT 14.

Tester 10 is also adapted for testing programmable logic devices (PLDs) such as programmable gate arrays of the type having in addition to a set of input and output terminals, one or more programming terminals for receiving serial programming data defining the logic the PLD is to carry out. When testing PLDs, tests are organized into successive programming and logic test cycles. During each DUT programming cycle a tester channel accessing a DUT programming terminal supplies a bit of serial programming data to the DUT while the tester channels accessing the DUT's logic signal input and output terminals are idle. During DUT logic test cycles, tester channels accessing programming terminals are idle while the tester channels accessing DUT input and output terminals carry out their logic test activities.

In additional to channels CH(1)–CH(N), tester 10 also includes a host computer 16, a system disk drive 17, a disk controller 18 and a disk drive 20 having a removable disk 22. Disk drive 17 stores the operating system and other software for host computer 16. During each logic test cycle, each channel CH(1)–CH(N) accessing a DUT 14 input or output terminal requires an instruction to tell it what to do during the test cycle. Disk 22 stores a separate set of a instructions for each tester channel CH(1)–CH(N) that is to access DUT 14 terminal during the test. To program channels CH(1)–CH(N) for a test, host computer 16 signals disk controller 18 to read the instructions for each tester channel CH(1)–CH(N) out of disk 22 and to write those instructions into an addressable instruction memory within the tester channel via a conventional memory bus 24. The host computer 16 then sends a START signal concurrently to all channels CH(1)–CH(N) telling them to begin the test. Thereafter each channel CH(1)–CH(N) reads and executes the instructions stored in its local instruction memory to determine what it is supposed to do during each cycle of the test. During the test a central clock signal generator 26 supplies a periodic master clock signal (MCLK) to each channel CH(1)–CH(N) for synchronizing activities of the channels.

Channel Architecture

FIG. 2 illustrates tester channel CH(1) in more detailed block diagram form. Channels CH(2)–CH(N) are similar. Referring to FIG. 2, channel CH(1) includes an addressable instruction memory 30 for storing a sequence of instructions and a conventional memory controller 32 allowing disk controller 18 of FIG. 1 to write instructions into instruction memory 30 via memory bus 24. To signal the start of a test, host computer 16 pulses the START signal providing an input to a state machine 34. A timing circuit 36 supplies a "period clock" signal (PCLK) as input to state machine 34. Timing circuit 36 receives the master clock signal MCLK as a timing reference and periodically pulses the PCLK signal to mark the start of each test cycle.

On the first pulse of the PCLK signal after receiving a START signal pulse, state machine 34 pulses a FIRST_INST signal input to memory controller 32. This tells controller 32 to address a 10-bit instruction stored at address 0 of instruction memory 30. The instruction includes a 2-bit opcode provided as input to state machine 34 and an 8-bit operand provided as input to a multiplexer 37. Multiplexer 37 has three 8-bit inputs and delivers one of its 8-bit inputs as a "VECTOR" data input to a formatting circuit 38 immediately prior to the start of each test cycle. The PCLK signal clocks the VECTOR data into formatting circuit 38 at the start of the test cycle. The VECTOR indicates the test action that channel CH(1) is to carry out at a DUT terminal during the test cycle. A VECTOR may indicate that at some time during the test cycle, the channel should either drive a test signal input to the DUT terminal to a high logic level, to a low logic level or to a tristate condition. Or a VECTOR may indicate that at some time during the test cycle the channel should sample a DUT output signal to determine whether it is of an expected state.

When the VECTOR indicates that the channel is to drive a test signal input to the DUT terminal to a high logic level, to a low logic level or to a tristate condition at some particular time, formatting circuit 38 sends a drive high (DH), drive low (DL) or tristate (Z) signal pulse to a pin electronics circuit 40 at the time during the test cycle indicated by the VECTOR. Formatting circuit 38 uses a set of TIMING signals produced by timing circuit 36 as timing references. The TIMING signals are of the same frequency as the period clock signal PCLK but are distributed in phase so that they divide each test cycle into several time slots during which a test activity may take place. Pin electronics circuit 40 responds to a DH, DL or Z signal pulse by driving the DUT terminal to the appropriate state.

The pin electronics circuit 40 also continuously compares the DUT output signal appearing at the DUT terminal to high and low logic levels and produces a pair of signals CH and CL indicating whether the signal is above a high logic level or below a low logic level. When a VECTOR indicates that at some time during the test cycle the channel should sample a DUT output signal to determine whether it is of an expected state, formatting circuit 38 looks at the CH and CL signals at the appropriate time, compares them to the expected state indicated by the VECTOR data, and transmits a FAIL signal pulse to the host computer 16 whenever the CH and CL signals are of unexpected states.

Prior to the start of each normal test cycle, state machine 34 pulses a NEXT_INST signal input to memory controller 32 causing it to increment the address of instruction memory 30 so that it reads out the next stored instruction. The 2-bit opcode provided as input to state machine 34 indicates a mode of operation of state machine 34 during the next test cycle. The four possible 2-bit opcode values of each 10-bit instruction output of instruction memory 30 are listed below.

Instruction Set

A "00" opcode puts state machine 34 in a "normal cycle" mode where, in response to a next pulse of the PCLK signal, state machine 34 sends a NEXT_INST pulse to the memory controller 32 to increment the read address of instruction memory 30 and sets a control signal input (SELECT) to multiplexer 37 to pass the 8-bit operand output of the instruction memory 30 as the VECTOR input to formatting circuit 38 for the next test cycle.

A "01" opcode in the instruction output of memory 30 puts state machine 34 in a "serial" mode. The accompanying 8-bit instruction operand indicates a number N (up to 256) of serial mode test cycles to follow. State machine 34 loads the operand into a counter 42, loads a selected number M of bits of a 12-bit "scan" data value appearing on a scan data bus 44 into a parallel-in/serial-out shift register 46, and then pulses a SCAN signal to tell the disk controller 18 to read a next 12-bit scan data word out of disk 22 and onto the scan data bus 44. On each of the next M PCLK cycles thereafter state machine 34 shifts a bit of scan data out of shift register 46 to an encoder 48. Encoder 48 converts the scan bit into an 8-bit VECTOR supplied to an input of multiplexer 37. State machine 34 sets multiplexer 37 to pass the output VECTOR of encoder 48 to formatting circuit 38. State machine 34 also clocks counter 42 after each PCLK signal pulse causing counter 42 to decrement its count. One every Mth pulse of the PCLK signal, the state machine 34 pulses the SHIFT_IN signal to load a next M bits of the 12-bit scan data word on bus 44 into shift register 46 and then signals disk controller 18 of FIG. 1 to place a next scan data word on scan data bus 44. When the count of counter 42 reaches 0 state machine 34 pulses the NEXT_INST signal to tell memory controller to increment the address of instruction memory 30 so that it reads out an instruction for the next test cycle.

A "10" opcode in the instruction output of memory 30 puts state machine 34 in a "halt" mode. This mode is used when the channel is to remain in a single state for N cycles, as for example when other channels are operating in the serial mode. The 8-bit operand indicates the number N (up to 256) of halt cycles to follow. State machine 34 loads the operand into counter 42 and sets multiplexer 37 to pass a "HALT" vector to formatting circuit 38. The HALT vector tells formatting circuit 38 to set the DUT pin to an appropriate high, low or tristate condition. State machine 34 then clocks counter 42 on each pulse of the PCLK signal and waits until counter 42 counts down to 0 before pulsing the NEXT_INST signal to obtain a next instruction from instruction memory 30.

A "11" opcode puts state machine 34 in a "stop" mode where it pulses a STOP control signal input to the host computer 16 of FIG. 1 to indicate that the test is complete. State machine 34 then waits until a next START signal pulse signals the start a new test.

Control Data

In addition to supplying instructions to each channel CH(1)–CH(N) before a test and supplying scan data to various channels during a test, disk 22 also supplies control data to each channel to set various operating characteristics of the channel. Before the start of the test, when disk controller 18 of FIG. 1 reads the channel instructions out of disk 22 and writes them into the instruction memory 30 of each channel CH(1)–CH(N), the disk controller also reads control data for each channel out of disk 22 and writes that control data into a set of addressable control registers 50 (FIG. 2) within the channel via memory bus 24 and memory controller 32. The control data stored in registers 50 tells shift register 46 which M bits of the 12-bit scan data word that it is to shift in. If the channel is the only channel using scan data during a test M is 12 and the channels' shift register 46 shifts in all 12 bits of scan data in response to each SHIFT_IN signal pulse. If for example four channels use scan data during a test, the control data tells the shift register 46 of each channel to shift in a particular set of three of the 12 scan data bits. The control data also tells state machine 34 how many scan bits are being shifted in so that state machine 34 knows how many test cycles to wait between successive SHIFT_IN pulses.

The control data stored in control registers 20 also determines how encoder 48 converts the scan data bit output of register 46 into VECTOR data, thereby controlling the action the channel takes in response to each of the two states of the scan data bit shifted out of shift register 46. The control data in registers 50 also sets the value of the HALT vector input to multiplexer 37 so as to control the action the channel takes at the DUT terminal while in the halt mode. The control data also sets the high and low logic levels pin electronics circuit 40 uses when driving a DUT input signal or when ascertaining the state of a DUT output signal.

The control data stored in registers 50 also provides inputs to timing circuit 36 defining a frequency of the period clock PCLK during normal mode operation and defining a frequency of the period clock PCLK during serial or halt mode operation. During serial or halt mode operation, state machine 34 asserts an alternate frequency (ALT_FREQ) signal input to timing circuit 36 that causes the timing circuit to set the PCLK frequency to the indicated serial/halt mode level. During normal mode operation, state machine 34 deasserts the ALT_FREQ signal causing timing circuit 36 to set the PCLK frequency to its normal mode level. Thus when the normal test cycle frequency is relatively high, timing circuit 36 can be programmed to slow down the PCLK clock frequency during serial/halt mode operation so that it does not exceed the frequency with which disk controller 18 can deliver scan data bits to the channels that need it.

Scan Testing

In testing a DUT having scan terminals, the sequence of instructions stored in the instruction memory 30 of each tester channel accessing a scan terminal will alternate the channel between serial and halt modes. The sequence of instructions stored in the instruction memory 30 of each tester channel accessing a normal DUT input or output terminal will alternate between normal and halt modes. During portions of the test when the scan terminals are active, the channels accessing those scan terminals operate in the serial mode while the channels accessing other DUT input/output terminals operate in the HALT mode. During portions of the test when the DUT input/output terminals are active, the channels accessing the scan terminals operate in the halt mode while channels accessing other DUT input/ output terminals operate in the normal mode.

DUT Programming

In testing a DUT such as a PLD having programming input terminals, the sequence of instructions stored in the instruction memory 30 of each tester channel accessing a programming terminal will operate in the serial mode to provide programming data to the DUT while the channels accessing other DUT input/output terminals operate in the HALT mode. During portions of the test when DUT logic is being tested, the channels accessing the programming terminals operate in the halt mode while channels accessing other DUT input/output terminals operate in the normal mode.

Thus has been described an IC tester having one channel per terminal of a DUT. In accordance with the invention, the tester includes a disk drive with a removable disk for supplying instructions to each channel before the test and for providing IC scan or DUT programming data to various tester channels during a test. Since a disk drive can store large amounts of data economically, use of the disk drive in accordance with the invention allows a test channel to supply large amounts of scan or programming data to a DUT during a test without having to first store that programming or scan data in an expensive memory. While the forgoing specification has described a preferred embodiment of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An integrated circuit (IC) tester for performing a test on an IC by carrying out test activities at terminals of the IC, wherein the test activities include transmitting test signals to the terminals and sampling IC output signals appearing at the terminals, the IC tester comprising:

a plurality of tester channels, each for carrying out test activities at a separate terminal of said IC during said test;

a first bus connected to each of said tester channels;

a disk drive including a disk for storing data words on the disk and reading data words from the disk, each data word referencing at least one of said test activities to be carried out during said test; and controller means for responding to a control signal by signaling said disk drive to read a data word stored on said disk and by transmitting the data word read by said disk drive to said plurality of tester channels via said first bus, wherein each said tester channel comprises:

instruction memory means for storing and reading out a sequence of instructions; and instruction execution means for causing said instruction memory means to read out said sequence of instructions during said test, and for executing each instruction of said sequence of instructions when it is read out of said instruction memory means, wherein said sequence of instructions includes normal cycle mode instructions and serial mode instructions, wherein said instruction execution means executes each of said normal cycle mode instructions during said test by carrying out a test activity referenced by the normal cycle mode instruction, and wherein said instruction execution means executes each of said serial mode instructions during said test by transmitting said control signal to said controller thereby causing said controller to signal said disk drive to read a data word stored on said disk and to transmit that data word via said first bus, by receiving a data word transmitted via said first bus, and by carrying out at least one test activity referenced by the data word it receives via said first bus.

2. The IC tester in accordance with claim 1 wherein said disk is a removable disk.

3. The IC tester in accordance with claim 1 further comprising a second bus linking said controller means to the instruction memory means of each channel, wherein said disk also stores separate sequence of instructions for each tester channel, and wherein prior to a start of said test, controller means acquires the sequence of instructions for each tester channel from said disk via said disk drive and transmits the tester channel's sequence of instructions via said second bus to the tester channel's instruction memory means, and wherein each tester channel's instruction memory means stores the sequence of instructions transmitted by said controller means via said second bus.

4. The IC tester in accordance with claim 1 wherein each of said serial mode instructions indicates a number of test activities defined by a data word transmitted via said first bus that are to be carried out by the instruction execution means when executing the serial mode instruction.

5. The IC tester in accordance with claim 4 wherein each instruction of said sequence of instructions includes an opcode and an operand, the opcode indicating whether the instruction is one of said normal cycle mode instructions or said serial mode instructions, wherein the operand of each of said normal cycle mode instructions defines a test activity to be carried out by the instruction execution means executing the normal cycle mode instruction, and wherein the operand of each of said serial mode instructions indicates how many of the test activities defined by a data word received via said first bus that are to be carried out by the instruction execution means executing the serial mode instruction.

6. The IC tester in accordance with claim 5 wherein the sequence of instructions stored in at least one of said instruction memory means also includes a halt mode instruction including an operand indicating a period during which the instruction execution means executing the halt mode instruction is to refrain from executing subsequent instructions of said sequence of instructions.

7. An integrated circuit (IC) tester for performing a test on an IC, wherein said test is organized into a succession of test cycles and wherein said tester carries out test activities at terminals of the IC during said test, wherein the test activities include transmitting test signals to said terminals and sampling IC output signals produced at said terminals, the IC tester comprising:

a bus;

first means for transmitting control data words sequentially on said bus during said test, wherein each tester channel is connected to said bus for receiving said control data words transmitted on said bus during said test, wherein during said test, each tester channel generates a sequence of instructions including normal cycle mode instructions and serial mode instructions, wherein each of said normal cycle mode instructions references one of said test activities to be carried out during one of said test cycles;

wherein during said test, each tester channel executes each of its generated normal cycle mode instructions by carrying out the test activity referenced by the generated normal cycle mode instruction during one of said test cycles, wherein each of said control data words references a plurality of said test activities and a plurality of tester channels, wherein during said test each tester channel executes each of its generated serial mode instructions by carrying out at least one of the plurality of test activities referenced by one of said control data words transmitted on said bus during at least one of said test cycles.

8. The IC tester in accordance with claim 7 wherein said first means comprises:

a disk for storing said control data words, and means for reading said control data words from said disk and for transmitting them sequentially on said bus during said test.

9. The IC tester in accordance with claim 7 wherein each generated serial mode instruction indicates how many of the plurality of test activities referenced by one of said control data words are to be carried out at a terminal of said IC.

10. The IC tester in accordance with claim 9 wherein each of said control data words comprises a plurality of bits, and wherein each bit references a separate one of said test activities.

11. The IC tester in accordance with claim 10 wherein said first means comprises:

a disk for storing said control data words, and means for reading said control data words from said disk and for transmitting them sequentially on said bus during said test.

12. The IC tester in accordance with claim 7 wherein said sequence of instructions generated by at least one of said tester channels also includes a halt instruction indicating a number of said test cycles, and wherein said at least one of said tester channels executes said halt instruction by halting its generation of said sequence of instructions for said number of said test cycles indicated by said halt instruction.

\* \* \* \* \*